(12) United States Patent
Cook et al.

(10) Patent No.: US 8,480,803 B2
(45) Date of Patent: Jul. 9, 2013

(54) METHOD OF MAKING AN ARTICLE OF SEMICONDUCTING MATERIAL

(75) Inventors: Glen Bennett Cook, Elmira, NY (US); Prantik Mazumder, Ithaca, NY (US); Balram Suman, Painted Post, NY (US); Christopher Scott Thomas, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 904 days.

(21) Appl. No.: 12/609,987

(22) Filed: Oct. 30, 2009

(65) Prior Publication Data

US 2011/0101281 A1    May 5, 2011

(51) Int. Cl.
*C30B 11/14* (2006.01)

(52) U.S. Cl.
USPC ............. 117/60; 117/21; 117/23; 117/24

(58) Field of Classification Search
USPC ............................ 117/60, 21, 23, 24
See application file for complete search history.

(56) References Cited

U.S. PATENT DOCUMENTS

| | | | |
|---|---|---|---|
| 3,948,650 A | 4/1976 | Flemings et al. | 75/135 |
| 4,112,135 A | 9/1978 | Heaps et al. | 427/11 |
| 4,128,680 A | 12/1978 | Heaps et al. | 428/137 |
| 4,137,355 A | 1/1979 | Heaps et al. | 428/201 |
| 4,243,472 A * | 1/1981 | O'Neill | 117/60 |
| 4,251,570 A | 2/1981 | Zook | 427/74 |
| 4,447,289 A | 5/1984 | Geissler et al. | 156/608 |
| 4,778,478 A | 10/1988 | Barnett | 437/5 |
| 5,712,199 A | 1/1998 | Nakagawa et al. | 438/62 |
| 6,231,667 B1 | 5/2001 | Iwane et al. | 117/55 |
| 6,581,415 B2 | 6/2003 | Chandra et al. | 65/66 |
| 6,596,075 B2 | 7/2003 | Igarashi et al. | 117/26 |
| 6,682,990 B1 | 1/2004 | Iwane et al. | 438/458 |
| 6,746,225 B1 | 6/2004 | McHugh | 425/130 |
| 6,802,900 B2 | 10/2004 | Iwane et al. | 117/54 |
| 6,946,029 B2 | 9/2005 | Tsukuda et al. | 117/16 |
| 7,071,489 B2 | 7/2006 | Tsukuda | 257/75 |
| 7,111,476 B2 | 9/2006 | Loxley et al. | 65/17.2 |
| 7,186,578 B2 | 3/2007 | Goma et al. | 438/22 |
| 7,294,197 B1 | 11/2007 | Gralenski | 117/37 |
| 2007/0175383 A1* | 8/2007 | Fukuda et al. | 117/35 |

FOREIGN PATENT DOCUMENTS

| | | |
|---|---|---|
| DE | 10392847 B4 | 7/2007 |
| EP | 1085559 A2 | 3/2001 |
| EP | 1113096 A1 | 4/2001 |
| JP | 60-213351 A | 10/1985 |

(Continued)

OTHER PUBLICATIONS

Tomoyuki, Takakura et al., "Effect of Rapid Thermal Process for CDS Silicon Solar Cell," poster, Sharp, Japan.

(Continued)

*Primary Examiner* — Bob M Kunemund
(74) *Attorney, Agent, or Firm* — Michael W. Russell

(57) ABSTRACT

A method of making an article of a semiconducting material involves withdrawing from a melt of molten semiconducting material a solid mold having already formed on an external surface of the mold a solid layer of the semiconducting material. During the act of withdrawal, one or more of a temperature, a force, and a relative rate of withdrawal are controlled in order to achieve one or more desired attributes in a solid overlayer of semiconductor material that is formed over the solid layer during the withdrawal.

15 Claims, 17 Drawing Sheets

FOREIGN PATENT DOCUMENTS

| WO | WO 2005/104244 A1 | 11/2005 |
|---|---|---|
| WO | WO 2009/002550 A1 | 12/2008 |
| WO | 2009/108358 A1 | 9/2009 |
| WO | 2010/099297 A1 | 9/2010 |
| WO | 2010/132651 | 11/2010 |
| WO | 2010/132664 A1 | 11/2010 |

OTHER PUBLICATIONS

Mitsuyasu, Hidemi et al., "Characteristics of CDS Silicon Wafers," poster, Sharp, Japan.

Li, J.G. and Hausner, H., "Wetting and adhesion in liquid silicon/ceramic systems," Materials Letters, 14 (1992), pp. 329-332.

Turnbull, D., "Formation of Crystal Nuclei in Liquid Metals," Journal of Applied Physics, 21 (Oct. 1950), pp. 1022-1028.

Turnbull, D., "Kinetics of Heterogeneous Nucleation," Journal of Chemical Physics, vol. 18, No. 2 (Feb. 1950), pp. 198-203.

Turnbull, D. and Fischer, J.C., "Rate of Nucleation in Condensed Systems," Journal of Chemical Physics, vol. 17, No. 1 (Jan. 1949), pp. 71-73.

Bell, R. O., "Growth of Silicon Sheets for Photovoltaic Applications," Journal of Materials Research, vol. 13, No. 10, Oct. 1998; pp. 2732-2739.

H. Yamatsugu, et al, "Crystallization on dipped substrate wafer technology for crystalline silicon solar cells reduces wafer costs," Photovoltaics International Journal $2^{nd}$ ed. Nov. 2008 p. 32-32.

Mazumder, P., and Trivedi, R., "Novel pattern forming process due to coupling of convection and phase change", Phys. Rev. Lett., vol. 88, 2002, pp. 235507.

Patent Application: Method of making an unsupported article of a pure or doped semiconducting element or alloy, Case SP08-055. U.S. Appl. No. 12/523,274, filed Jul. 15, 2009.

Patent Application: Methods of treating semiconducting materials and treated semiconducting materials, Case SP08-134. U.S. Appl. No. 12/156,499, filed Jun. 2, 2008.

Patent Application: Methods of making an unsupported article of semiconducting material by controlled undercooling, Case SP09-063 filed Feb. 27, 2009.

Patent Application: Method of making an article on a mold comprising semiconduction material, Case SP09-108 U.S. Appl. No. 12/466,143, filed May 14, 2009.

Levich, V. G, "Physicochemical Hydrodynamics", Prentice-Hall Inc. Englewood Cliffs, NJ, 1962.

Kalejs, J. P., "Silicon ribbons and foils state of the art," Solar Energy Materials & Solar Cells, vol. 72, 2002, pp. 139-153.

Hanoka, J. I., "An overview of silicon ribbon growth technology," Solar Energy Materials & Solar Cells, vol. 65, 2001, pp. 231-237.

Ciszek, T.F., "Review Paper: Techniques for the Crystal Growth of Silicon Ingots and Ribbons," Journal of Crystal Growth, vol. 66, 1984, pp. 655-672.

Yeckel, A., Salinger, A.G., and Derby, J.J., "Theoretical analysis and design considerations for float-zone refinement of electronic grade silicon sheets," Journal of Crystal Growth, vol. 152, 1995, pp. 51-64.

Heaps, et al., "Dip-Coated Sheet Silicon Solar Cells." Photovoltaic Specialists Conf, $12^{th}$ IEEE, vol. A78-10902 01-44, (1976), pp. 147-150, XP008131456.

Zoutendyke, "Gas Jet Miniscus Control in Ribbon Growth", NASA Tech Briefs, NASA, Washington, U.S., (Mar. 1, 1984), XP002159841.

Lowe, "Gas Jets Shape Silicon Ribbon", Electronics International, vol. 53, No. 24., (Nov. 1, 1980), pp. 40-41, XP1302467, New York, NY, USA.

Jorgensen, "Elaboration de Monocristaux en Feuilles Geantes et Traitements", Orbit, vol. 5, No. 9, (Nov. 1, 1970), pp. 15-23, XP001302476.

\* cited by examiner

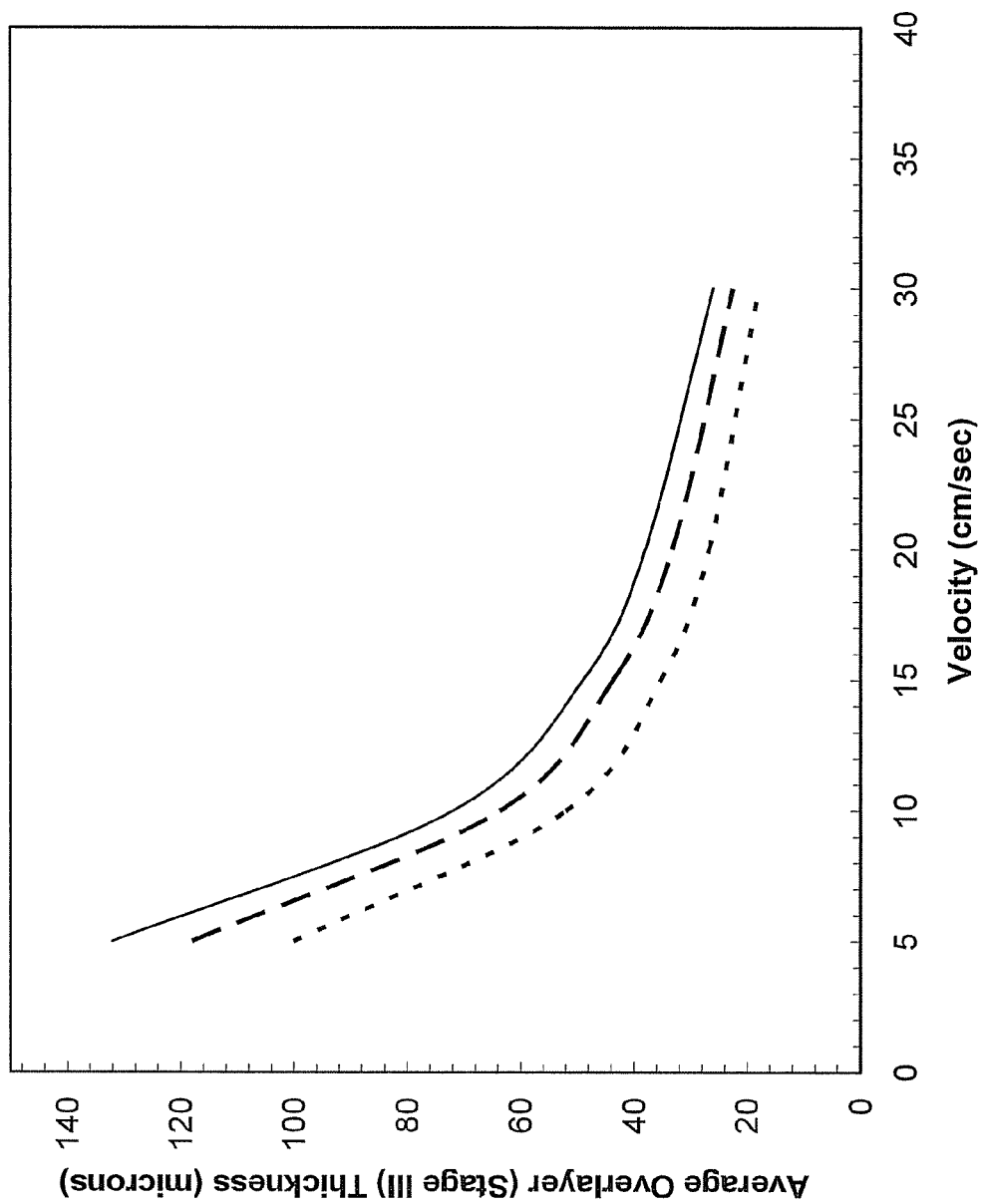

METHOD OF MAKING AN ARTICLE OF SEMICONDUCTING MATERIAL

FIELD

The disclosure relates to methods of making an article of semiconducting material, and more particularly to exocasting methods whereby an article of semiconducting material is formed over an external surface of a mold.

BACKGROUND

Semiconducting materials are used in a variety of applications, and may be incorporated, for example, into electronic devices such as photovoltaic devices. Photovoltaic devices convert light radiation into electrical energy through the photovoltaic effect.

The properties of semiconducting materials may depend on a variety of factors, including crystal structure, the concentration and type of intrinsic defects, and the presence and distribution of dopants and other impurities. Within a semiconducting material, the grain size and grain size distribution, for example, can impact the performance of resulting devices. By way of example, the electrical conductivity and thus the overall efficiency of a semiconductor-based device such as a photovoltaic cell will generally improve with larger and more uniform grains.

For silicon-based devices, silicon may be formed using a variety of techniques. Examples include silicon formed as an ingot, sheet or ribbon. The silicon may be supported or unsupported by an underlying substrate. Such conventional methods of making supported and unsupported articles of silicon have a number of shortcomings.

Methods of making unsupported thin semiconducting material sheets, including silicon sheets, may be slow or wasteful of the semiconducting material feedstock. Unsupported single crystalline semiconducting materials can be produced, for example, using the Czochralski process. However, such bulk methods may disadvantageously result in significant kerf loss when the material is cut into thin sheets or wafers. Additional methods by which unsupported polycrystalline semiconducting materials can be produced include electromagnetic casting and ribbon growth techniques. However, these techniques tend to be slow and expensive. Polycrystalline silicon ribbon produced using silicon ribbon growth technologies is typically formed at a rate of only about 1-2 cm/min.

Supported semiconducting material sheets may be produced less expensively, but the semiconducting material sheet may be limited by the substrate on which it is formed, and the substrate may have to meet various process and application requirements, which may be conflicting.

Useful methods for producing unsupported polycrystalline semiconducting materials are disclosed in commonly-owned U.S. Provisional Patent Application No. 61/067,679, filed Feb. 29, 2008, titled "Method of Making an Unsupported Article of a Pure or Doped Semiconducting Element or Alloy," and U.S. Patent Application No. PCT/US09/01268, filed Feb. 27, 2009, titled "Methods of Making an Unsupported Article of Pure of Doped Semiconducting Element or Alloy," the disclosures of which are hereby incorporated by reference.

As described herein, the inventors have now discovered additional methods by which supported and unsupported articles of semiconducting materials may be made. The disclosed methods may facilitate formation of exocast semiconducting materials having desirable attributes such as improved crystal grain structure, reduced concentrations of impurities and/or defects, low surface roughness, and uniform thickness while reducing material waste and increasing the rate of production.

SUMMARY

In accordance with various exemplary embodiments, a method of making an article of a semiconducting material comprises providing a mold submersed in molten semiconducting material having already formed on an external surface of the mold a solid layer of the semiconducting material. A relative position of the mold is changed with respect to the molten semiconducting material so as to withdraw the mold having the solid layer from the molten semiconducting material. During the withdrawal, one or more of a temperature, a force, and a relative rate of withdrawal are controlled. By manipulating one or more of these process variables, it is possible to achieve one or more desired attributes in a solid overlayer of semiconductor material that is formed over the solid layer during the act of withdrawal. According to the disclosed method, it is possible to minimize the thickness and/or minimize the surface roughness of the overlayer.

As used herein, the term "semiconducting material" includes materials that may exhibit semiconducting properties, such as, for example, silicon, alloys and compounds of silicon, germanium, alloys and compounds of germanium, gallium arsenide, alloys and compounds of gallium arsenide, alloys and compounds of tin, and combinations thereof. In various embodiments, the semiconducting material may be pure (such as, for example, intrinsic or i-type silicon) or doped (such as, for example, silicon containing at least one n-type or p-type dopant, such as phosphorous or boron, respectively).

As used herein, the phrases "article of semiconducting material," "exocast article," and variations thereof include any shape or form of semiconducting material made using the disclosed methods. Examples of such articles may be smooth, textured, flat, curved, bent, angled, symmetric or asymmetric. Articles of semiconducting materials may comprise forms such as, for example, sheets, wafers or tubes.

As used herein, the term "mold" means a physical structure having an external surface upon or over which the article of semiconducting material can be formed. Molten or solid semiconducting material need not physically contact an external surface of the mold, although contact may occur.

As used herein, the term "external surface of a mold" means a surface of the mold that may be exposed to molten semiconducting material upon submersion of the mold into the molten semiconducting material.

As used herein, the term "supported" means that an article of semiconducting material is integral with a mold. The supported article of semiconducting material may optionally remain on the mold for further processing.

As used herein, the term "unsupported" means that an article of semiconducting material is not integral with a mold. The unsupported article of semiconducting material may be supported by a mold while it is being formed, but is then separated from the mold.

As used herein, the phrase "form a solid layer of a semiconducting material over an external surface of a mold" and variations thereof mean that at least some of the semiconducting material from the molten semiconducting material solidifies on or over an external surface of the mold.

As used herein, the term "crystalline" means any material comprising a crystal structure, including, for example, single crystal and polycrystalline semiconducting materials.

As used herein, the term "polycrystalline" includes any material comprised of a plurality of crystal grains. For example, polycrystalline materials may include micro-crystalline and nano-crystalline materials.

As used herein, the terms, "temperature of the molten semiconducting material," "bulk temperature of the molten semiconducting material," and variations thereof mean the average temperature of the molten semiconducting material contained within a vessel. Localized temperatures within the molten semiconducting material may vary spatially at any point in time, such as, for example, in areas of the molten semiconducting material proximate to the mold while the mold is submersed, or molten semiconducting material exposed to atmospheric conditions near a top surface of the vessel. In various embodiments, the average temperature of the molten semiconducting material is substantially uniform despite any localized temperature variation.

As used herein, the term "undercooling" refers to a process by which a temperature difference is generated between the molten semiconducting material and the mold, which may cause solidification of the molten semiconducting material. The amount of undercooling may be measured in degrees Celsius (° C.) or degrees Fahrenheit (° F.).

Methods of affecting the thickness and/or morphology of a solid overlayer formed during an exocasting process are described herein. In the description that follows, certain aspects and embodiments will become evident. It should be understood that the invention, in its broadest sense, could be practiced without having one or more features of these aspects and embodiments. It should be understood also that these aspects and embodiments are merely exemplary and explanatory, and are not restrictive of the invention as claimed.

BRIEF DESCRIPTION OF DRAWINGS

The following figures, which are described below and which are incorporated in and constitute a part of the specification, illustrate exemplary embodiments and are not to be considered limiting of the scope of the invention. The figures are not necessarily to scale, and certain features and certain views of the figures may be shown exaggerated in scale or in schematic in the interest of clarity and conciseness.

FIG. 6 is a theoretical graph of a solid layer thickness versus withdrawal rate for different initial mold temperatures.

DETAILED DESCRIPTION

In an exocasting process, a solid mold is submersed into and then withdrawn from a volume of molten semiconducting material. Due in large part to heat loss to the mold and the surroundings, a portion of the molten semiconducting material undergoes a liquid-to-solid phase transformation, which results in the formation of a solid layer of the semiconducting material over an external surface of the mold. In the process, the mold acts as both a heat sink and a solid form for the solidification to occur.

Figure 1A:
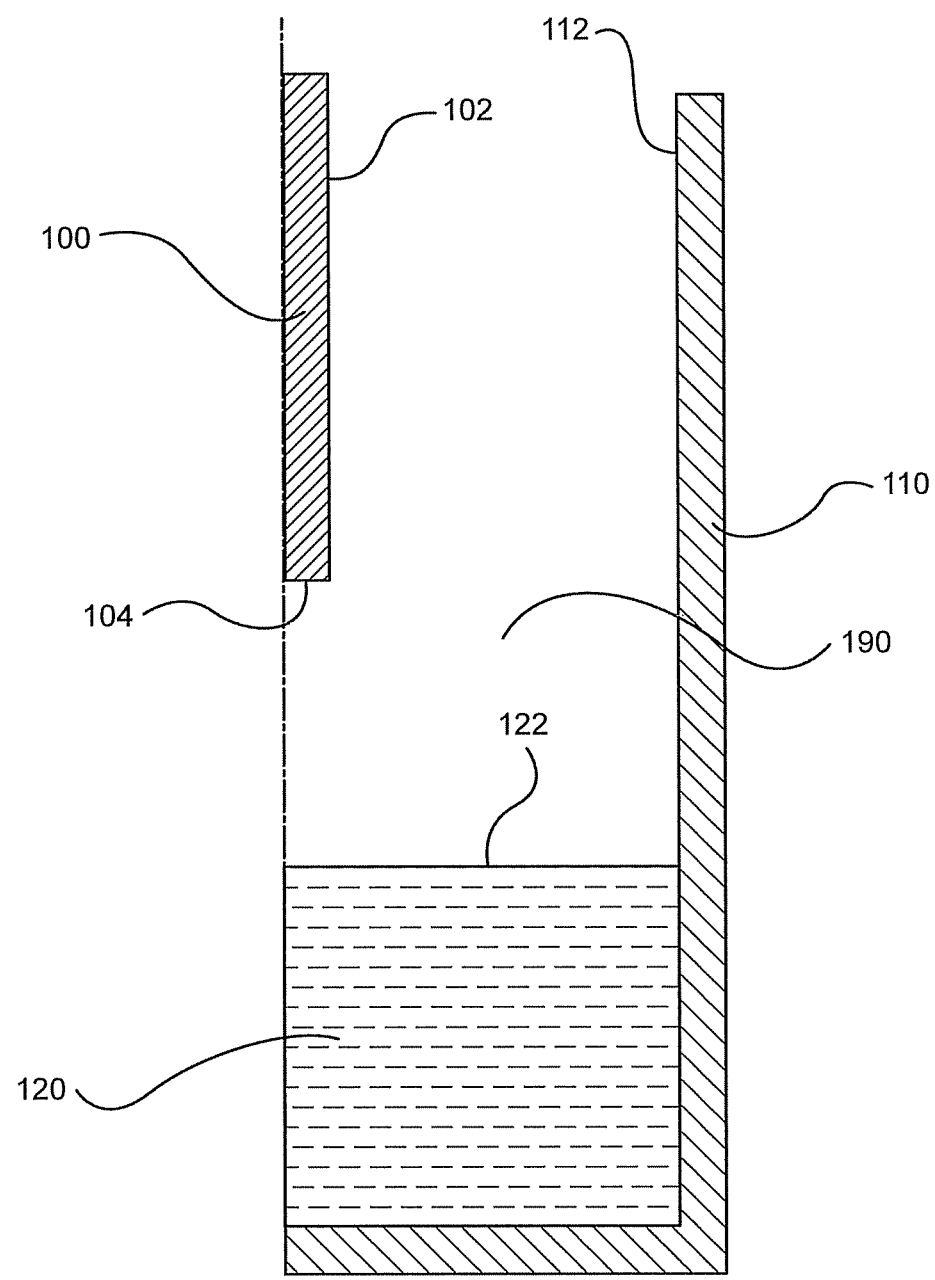
FIGS. 1A-1L illustrate an exemplary exocasting method for making an article of semiconducting material.

As shown in FIG. 1A, solid mold 100 having an external surface 102 is suspended above a vessel 110 containing a molten semiconducting material 120. Mold 100 may be in any form suitable for use in the disclosed methods. For example, mold 100 may be in the form of a monolith or wafer having a thickness ranging from 0.5 mm to 5 mm. Mold 100 may comprise a porous or a non-porous body, optionally having one or more porous or non-porous coatings. Mold 100 may comprise one or more flat external surfaces 102 or one or more curved external surfaces. A curved external surface may be convex or concave. The mold and its external surface(s) may be characterized by features including shape, dimension, surface area, surface roughness, etc. One or more of these features may be uniform or non-uniform. It will be understood that the features of the mold 100 and its external surface 102 may affect the properties of resulting exocast article.

It will be appreciated that although mold 100 and external surface 102 are illustrated in two-dimensional cross-section, mold 100 is a three-dimensional body and the solid layer 140 that forms over the external surface 102 of the mold is also a three-dimensional body having a length, a width and a thickness. As disclosed in additional detail hereinafter, the exocast solid layer 140 is formed during different stages of the exocasting process and comprises solid material formed during at least three stages of solidification.

In embodiments, mold 100 is formed from a material that is compatible with the molten semiconducting material 120. For example, the mold 100 may be formed from a material that does not melt or soften when submersed. As a further example, the mold 100 may be thermally stable and/or chemically inert to the molten semiconducting material 120, and therefore non-reactive or substantially non-reactive with the molten semiconducting material.

By way of example, the mold 100 may comprise or consist of materials such as fused silica, graphite, silicon nitride, single crystal or polycrystalline silicon, as well as combinations and composites thereof. In at least one embodiment, mold 100 is made of polycrystalline silicon dioxide.

The molten semiconducting material 120 may be provided by melting a suitable semiconducting material in vessel 110. Vessel 110 may be made from a material chosen from vitreous silica, graphite, and silicon nitride. The semiconducting material may be photovoltaic-grade or purer silicon. In addition to silicon, the molten semiconducting material may be chosen from alloys and compounds of silicon, alloys and compounds of tin, germanium, alloys and compounds of germanium, gallium arsenide, alloys and compounds of gallium arsenide, and combinations thereof.

The molten semiconducting material may comprise at least one non-semiconducting element that may form a semiconducting alloy or compound. For example, the molten semiconducting material may comprise gallium arsenide (GaAs), aluminum nitride (AlN) or indium phosphide (InP).

According to various embodiments, the molten semiconducting material 120 may be pure or doped. Example dopants, if present, may include boron, phosphorous, or aluminum, and may be present in any suitable concentration, e.g., 1-100 ppm, which may be chosen based on, for example, the desired dopant concentration in the resulting article of semiconducting material.

To form an article of a semiconducting material, mold 100 is at least partially submersed into molten semiconducting material 120 and then withdrawn. During the acts of submersion and withdrawal, the molten semiconducting material 102 solidifies and forms a solid layer 140 of semiconducting material over an external surface 102 of the mold.

Without wishing to be bound by theory, solidification occurs in three principal stages. The exocasting process, including a more detailed description of solidification in Stages I-III, can be understood with reference to FIGS. 1A-1L, which portray a series of sequential schematic illustrations of the process according to various embodiments. The submersion of the mold 100 into molten semiconducting material 120 is illustrated schematically in FIGS. 1A-1F, while withdrawal of the mold 100 from the molten semiconducting material 120 is illustrated schematically in FIGS. 1G-1L.

In one exemplary embodiment, using any suitable heating device or method, mold 100 may be brought to a temperature, $T_M$, and the molten semiconducting material 120 may be brought to a bulk temperature, $T_S$, which is greater than or equal to a melting temperature of the semiconducting material.

At least one heating element (not shown) may be used to heat mold 100, vessel 110 and/or maintain the molten semiconducting material 120 at a desired temperature. Examples of suitable heating elements include resistive or inductive heating elements, infrared (IR) heat sources (e.g., IR lamps), and flame heat sources. An example of an inductive heating element is a radio frequency (RF) induction heating element. RF induction heating may provide a cleaner environment by minimizing the presence of foreign matter in the melt.

The composition of the atmosphere 190 above the molten semiconducting material 120 can be controlled before, during, and after submersion. It is believed that the use of vitreous silica for the mold 100 and/or vessel 110 may lead to oxygen contamination of the article of semiconducting material. Thus, in various embodiments, oxygen contamination may optionally be mitigated or substantially mitigated, by melting the semiconducting material and exocasting the article in a low-oxygen environment, comprising, for example a dry mixture of hydrogen (e.g., less than 1 ppm water) and an inert gas such as argon, krypton or xenon. A low-oxygen environment may include one or more of hydrogen, helium, argon, or nitrogen. In at least one exemplary embodiment, the atmosphere may be chosen from an Ar/1.0 wt % $H_2$ mixture or an Ar/2.5 wt % $H_2$ mixture.

Prior to submersion (FIG. 1A) the temperature of the mold $T_M$ and the temperature of the molten semiconducting material $T_S$ each can be controlled such that $T_M<T_S$. In embodiments where the molten semiconducting material comprises silicon, the bulk temperature of the molten silicon, $T_S$, may range from 1414° C. to 1550° C., such as, for example, from 1450° C. to 1490° C., e.g., 1460° C. The temperature of the mold, $T_M$, may range from −50° C. to 1400° C. (e.g., from −35° C. to 0° C., 20° C. to 30° C., 300° C. to 500° C.) prior to submersion in the molten semiconducting material 120. In addition to controlling the mold and molten semiconducting material temperatures, the temperature of the radiant environment, $T_E$, such as a wall 112 of the vessel 110, may also be controlled.

Figure 1B:
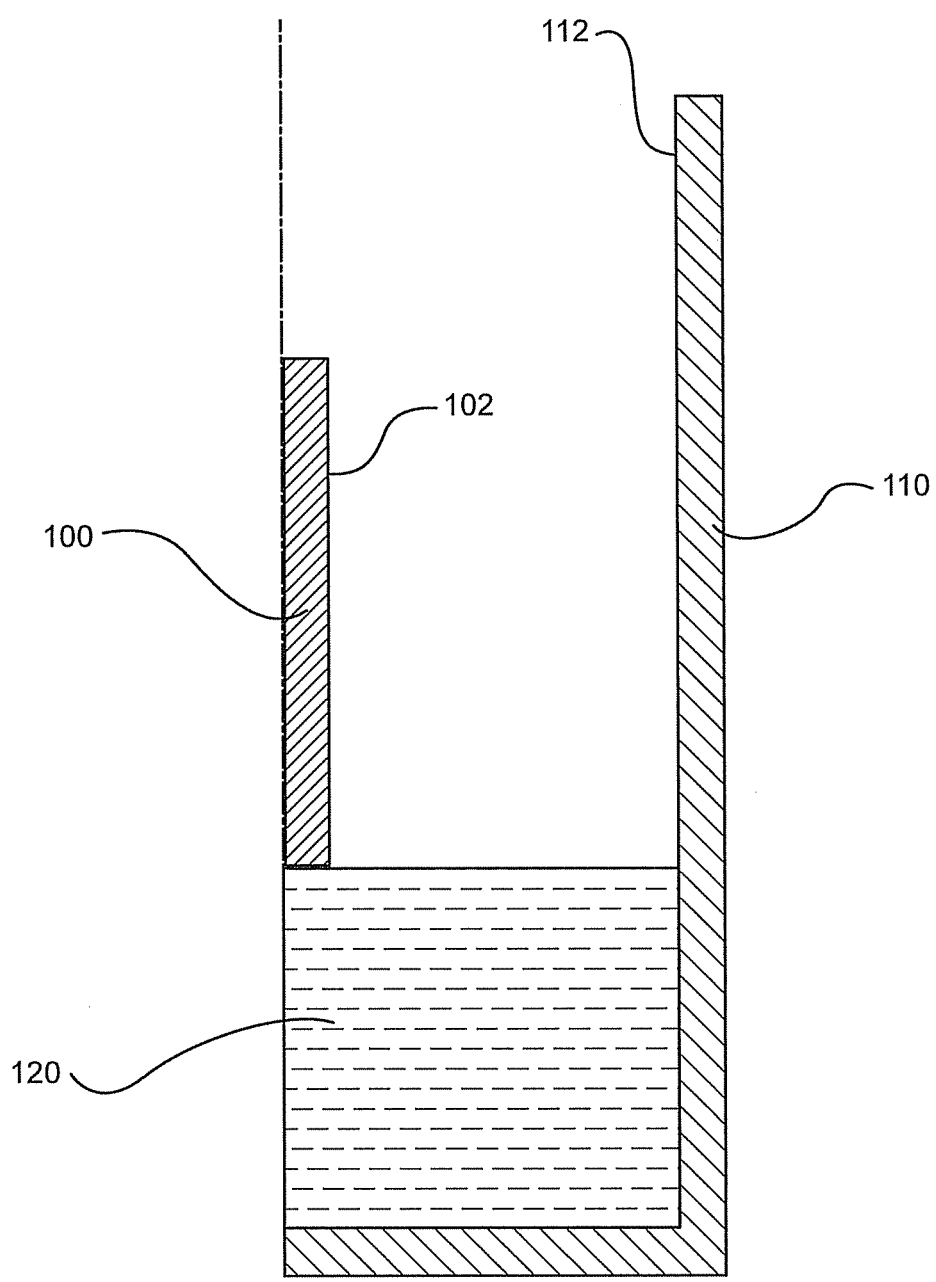
Figure 1C:
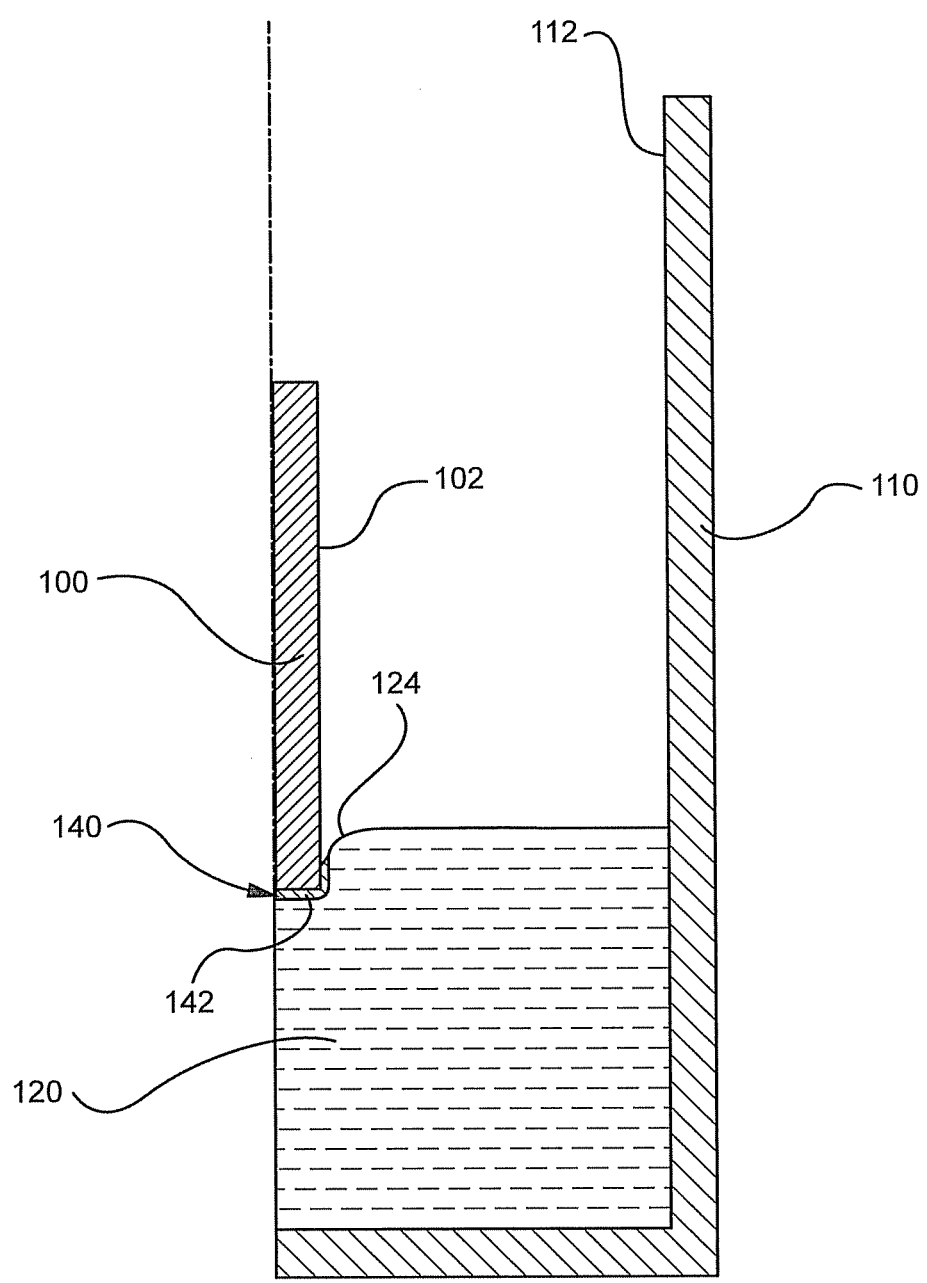

Referring to FIGS. 1B and 1C, as the mold 100 is brought closer to and then submersed into the molten semiconducting material 120, a temperature of the mold, e.g., a temperature of the mold 100 at leading edge 104, will increase due initially to radiative and then conductive and convective heat transfer from the molten semiconducting material 102 to the mold 100.

In embodiments where the mold 100 comprises silica and the molten semiconducting material 120 comprises silicon, a convex meniscus 124 will form at the point of entry of the mold into the molten silicon because silicon does not readily wet to the mold's silica surface.

Initially, the temperature of the mold 100 will remain less than the temperature of the molten semiconducting material 120. As the mold is submersed further into the molten semiconducting material (FIGS. 1D and 1E), a relatively large temperature difference between the mold 100 and the molten semiconducting material 120 will induce a liquid-to-solid phase transformation that results in the formation of a solid layer 140 of the semiconducting material over the external surface 102 of the mold.

The magnitude of the temperature difference between the mold 100 and the molten semiconducting material 120 can affect the microstructure and other properties of the solid layer 140. The combination of a relatively large temperature gradient between the mold 100 and the molten semiconducting material 120, which may be on the order of 800° C., results in a Stage I solid layer 142 over the external surface of the mold that may comprise a relatively fine grain size.

Figure 1D:
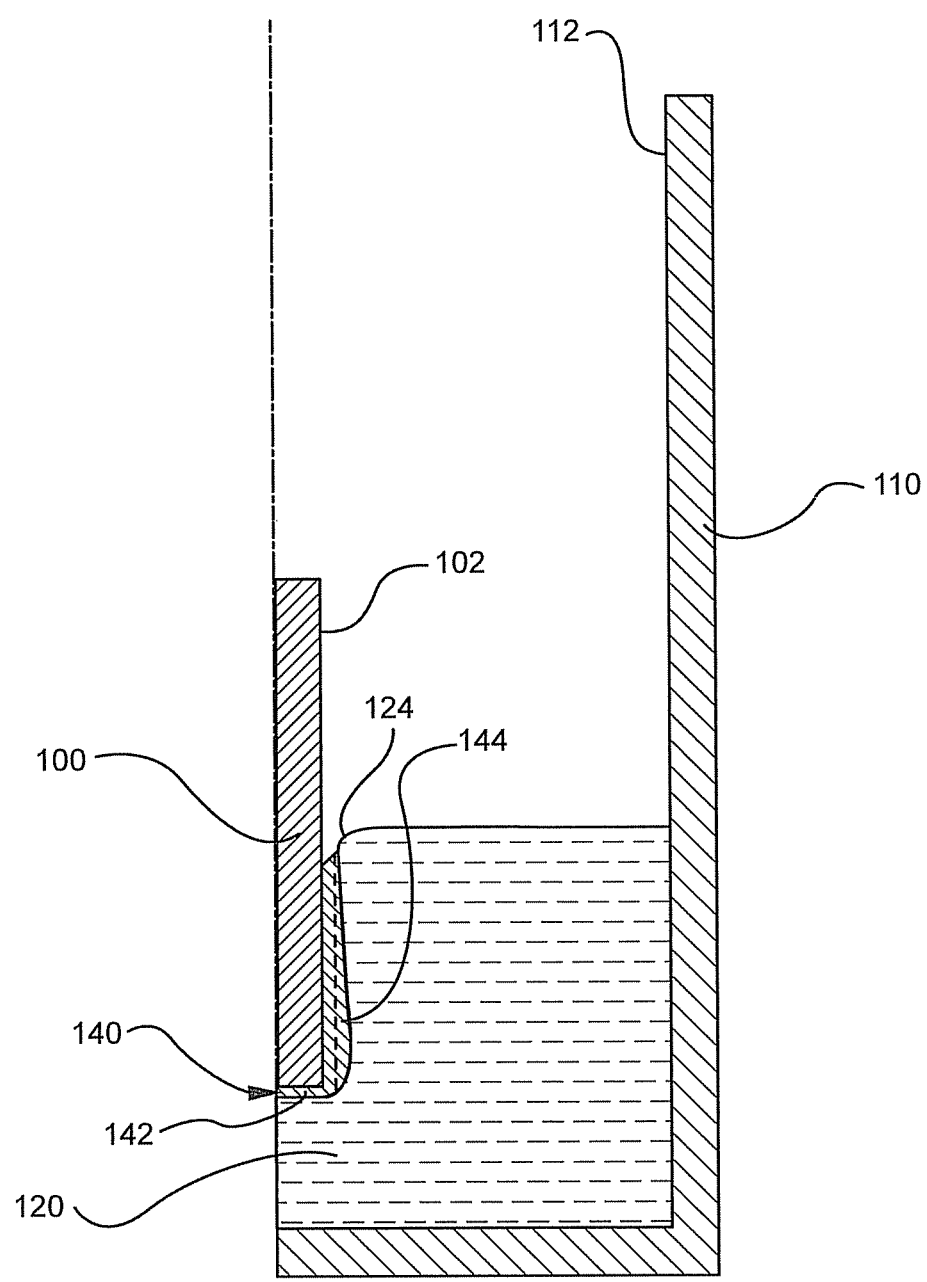
Figure 1E:
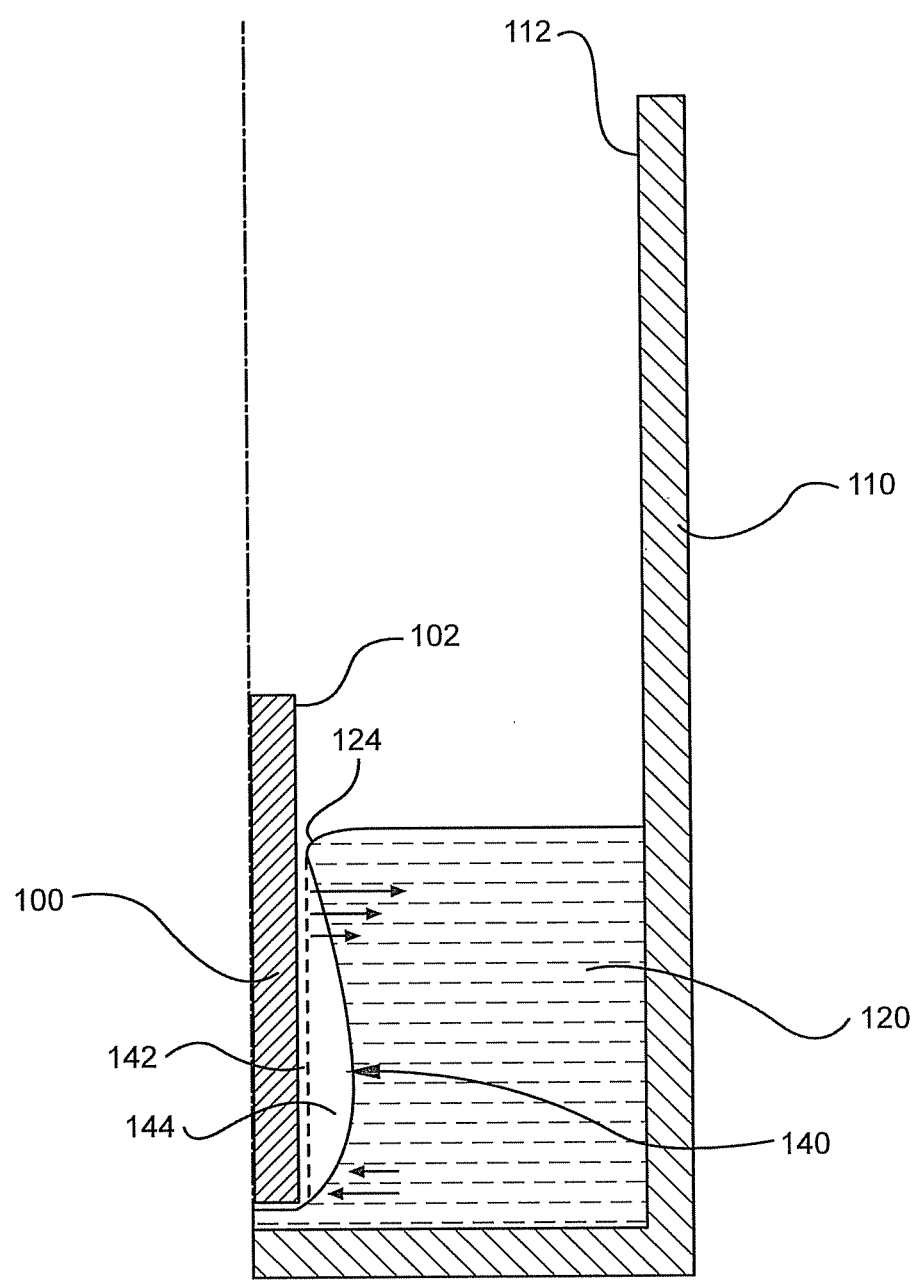

As shown in FIGS. 1C-1E, as the mold 100 is submersed, molten semiconducting material 120 is first solidified at the leading edge 104 of the mold 100. As the mold is further submersed, a thin Stage I solid layer 142 forms over the exposed surface 102 of the mold. The growth front of the Stage I solid layer 142 is continuously fed during immersion by molten material from the convex meniscus 124, and the growth direction of the Stage I solid layer 142 is substantially parallel to the relative direction of motion between the mold and the melt (i.e., the growth direction of the Stage I solid layer is substantially parallel to the exposed surface 102 of the mold).

According to embodiments, mold 100 may be rotated or vibrated as it is submersed. In other embodiments, however, the mold is maintained essentially stationary in the transverse dimensions as it is lowered into and raised out of the molten semiconducting material 120.

Figure 1F:
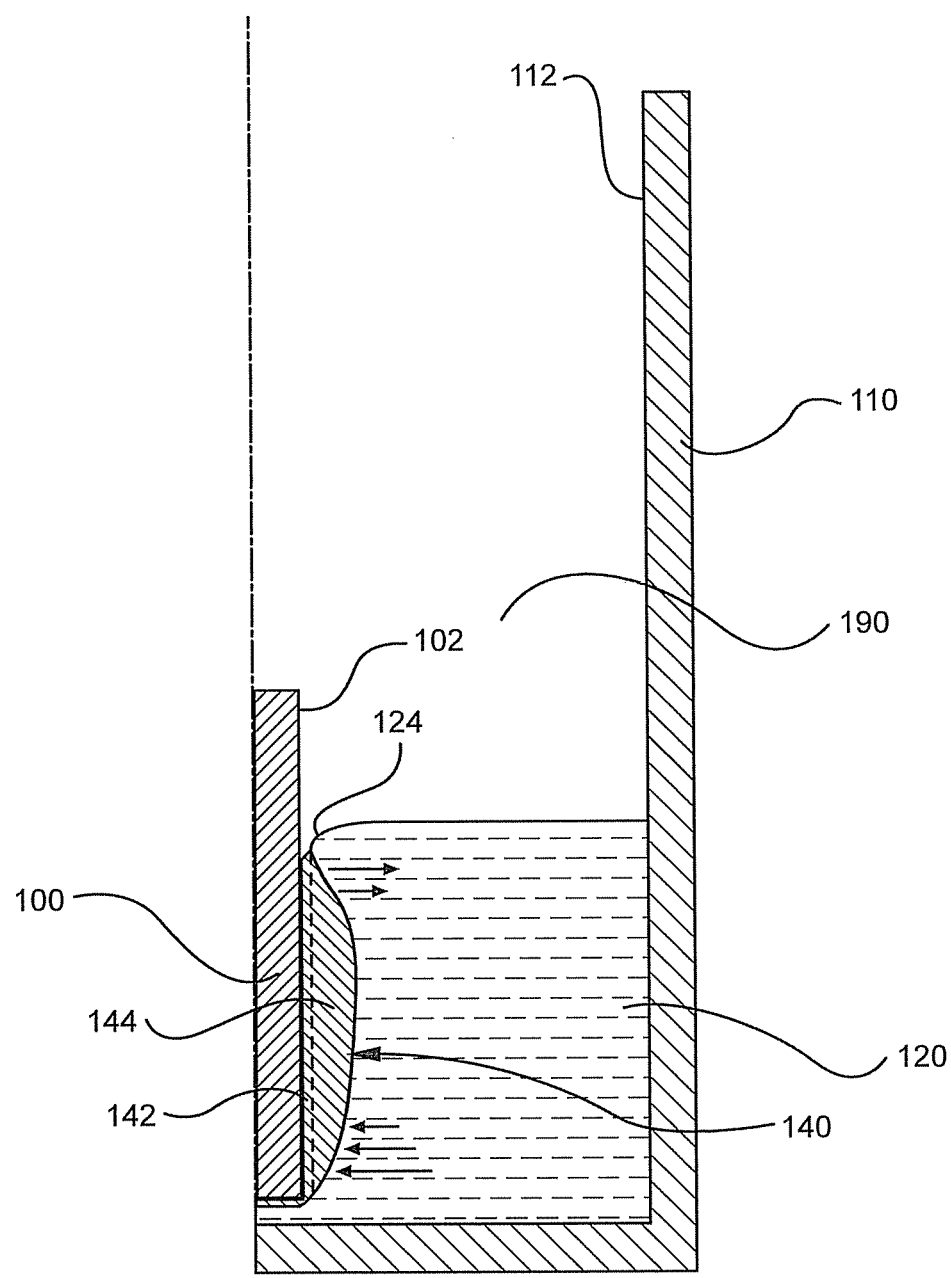

As shown in FIGS. 1D-1F, with the mold 100 at least partially submersed in the molten semiconducting material 120, the Stage I solid layer 142 (formed via a growth interface having a growth direction substantially parallel to the external surface of the mold) becomes the template for the formation of a Stage II solid layer, where molten semiconducting material 120 from the melt solidifies at the exposed surface of the Stage I solid layer. Initial formation of a Stage II solid layer 144, which typically occurs at a lower temperature differential than Stage I growth, can increase the thickness of the solid layer 140. Thus, in contrast to Stage I growth, the Stage II solid layer 144 is formed via a growth interface having a growth direction that is substantially perpendicular to the external surface of the mold. Experimental data reveal that the growth rate during Stage II growth can be on the order of 100 µm/sec.

The microstructure of the solid layer 140 (including the Stage I and Stage II solid layers), in addition to its dependence on the temperature gradient between the mold and the melt, is a function of the rate at which the relative position of the mold 100 is changed with respect to the molten semiconducting material 120. At relatively slow submersion velocities (e.g., on the order of about 1 cm/sec), the temperature differential between the mold 100 and the molten semiconducting material 120 is reduced due to heating of the mold, which generally results in a solid layer 140 having relatively large grains but a relatively small total thickness. On the other hand, at submersion velocities on the order of about 50 cm/sec, the relatively high velocity can disturb the shape of the convex meniscus 124, which can disrupt continuous grain growth and result in a discontinuous solid layer 140 having relatively small crystal grains. In embodiments, the submersion rate can be from about 1 to 50 cm/sec, e.g., 2, 5, or 20 cm/sec.

Quiescent growth of the solid layer during Stage II is a function of the total submersion time (i.e., residence time), which, due to the dynamic nature of the exocasting process, will vary spatially over the external surface of the mold 100. Because the leading edge 104 of the mold is the first part of the mold to be submersed, initial growth of the Stage II solid layer 144 can be fastest at or near the leading edge 104 where the temperature differential is the greatest. On the other hand, because the leading edge of the mold is the last part of the mold to be withdrawn, remelting of the Stage II solid layer 144 near the leading edge 104 can decrease the thickness of the solid layer 140 near the leading edge 104.

Mold 100 may be submersed in the molten semiconducting material 120 for a period of time sufficient to allow a solid layer 140 of the semiconducting material to solidify over a surface 102 of the mold 100. The mold 100 may be submersed in the molten semiconducting material 120 for up to 30 seconds or more (e.g., from 0.5 to 30 seconds). By way of a further example, the mold 100 may be submersed for up to 10 seconds (e.g., from 1 to 4 seconds). The submersion time may be varied appropriately based on parameters known to those of skill in the art, such as, for example, the temperatures and heat transfer properties of the system, and the desired properties of the article of semiconducting material.

Figure 2:
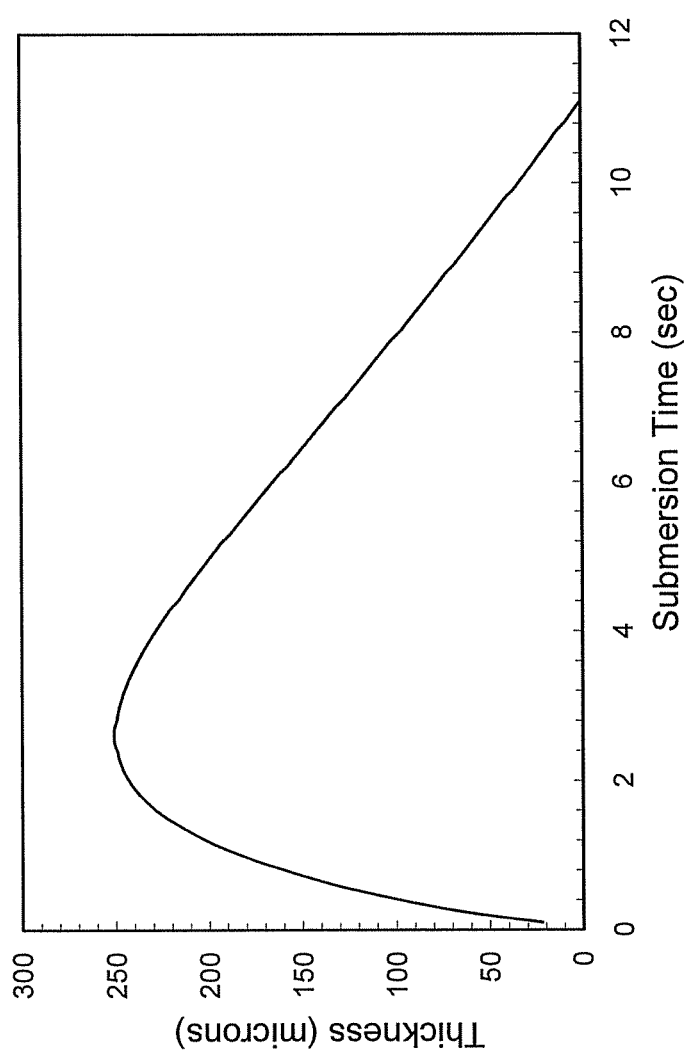
FIG. 2 is a theoretical graph of a solid layer thickness versus submersion time.

FIG. 2 shows a calculated graph of solid layer thickness measured from the external surface 102 of mold 100 as a function of submersion time. Over an initial time period, the solid layer grows rapidly to a maximum thickness. The thickness then decreases over a subsequent time period. Without wishing to be bound by theory, it is believed that during the initial time period, solidification of the molten semiconducting material commences at the interface between the Stage I solid layer 142 and the melt, and the Stage II layer 144 advances into the molten semiconducting material, which results in a positive rate of growth for the solid layer 140. During the subsequent time period, as the temperature of the mold increases and the heat capacity of the mold is exhausted, remelting of the Stage II layer 144 takes place, which results in a negative rate of growth. If the mold were left in the molten semiconducting material 120 indefinitely, eventually the entire solid layer 140 (Stage I and Stage II solid layers) would remelt and dissipate as the mold thermally equilibrates with the molten semiconducting material.

The dynamics of both the growth and the remelting of the Stage II layer 140 can also be seen with particular reference to FIGS. 1E and 1F. In FIG. 1E, as the mold 102 is near the full extent of its immersion into the molten semiconducting material 120, the Stage II layer 144 can have a non-uniform thickness. Near the leading edge 104 of mold 100, where the average mold temperature is greatest due to its longer total submersion time, the Stage II layer 144 begins to remelt as the direction of the local heat flux is outward from the mold. The remelting causes a local thinning of the Stage II layer 144 near the leading edge 104. At the other end of the mold, which has a lower average mold temperature, the direction of the local heat flux is still into the mold. Absorption of heat by the mold 102 results in growth of the Stage II layer into the melt.

Referring next to FIG. 1F, a shift in the non-uniform thickness of the Stage II layer 144 can be seen over the length of the mold as the mold temperature increases and additional remelting progresses. The small arrows in FIGS. 1E and 1F qualitatively indicate the relative solid layer growth rates at different locations along the interface between the Stage II solid layer 144 and the molten semiconducting material 120.

Thus, during submersion, a Stage I solid layer 142 forms over and optionally in direct contact with the exposed surface 102 of the mold 100. In turn, a Stage II solid layer 144 forms over and in direct contact with the Stage I solid layer 142. In embodiments, absent complete remelting of the solid layer 140, the thickness of the Stage I solid layer remains substantially constant during submersion and withdrawal, while the thickness of the Stage II solid layer is dynamic and a function of heat transfer dynamics. A dashed line in FIGS. 1D-1K marks the boundary between the Stage I and Stage II solid layers 142, 144.

Additional aspects of the growth and remelting of the solid layer as a function of the submersion time of the mold are described in commonly-owned U.S. patent application Ser. Nos. 12/466,120 and 12/466,143, each filed May 14, 2009, the disclosures of which being hereby incorporated by reference.

The portion of the exocasting process when the mold 100 is being submersed into the molten semiconducting material 120 is described above and is shown schematically in cross-section in FIGS. 1A-1F. In particular FIG. 1F shows the position of the mold and the formation of solid layer 140 when the mold is at its maximum extent of submersion and the velocity of the mold with respect to the molten semiconducting material 120 is zero. A further portion of the exocasting process (i.e., when the mold 100 is being withdrawn from the molten semiconducting material 120), including the formation of a Stage III solid layer 146 over a surface of the mold, is described next with particular reference to FIGS. 1G-1L.

Figure 1G:
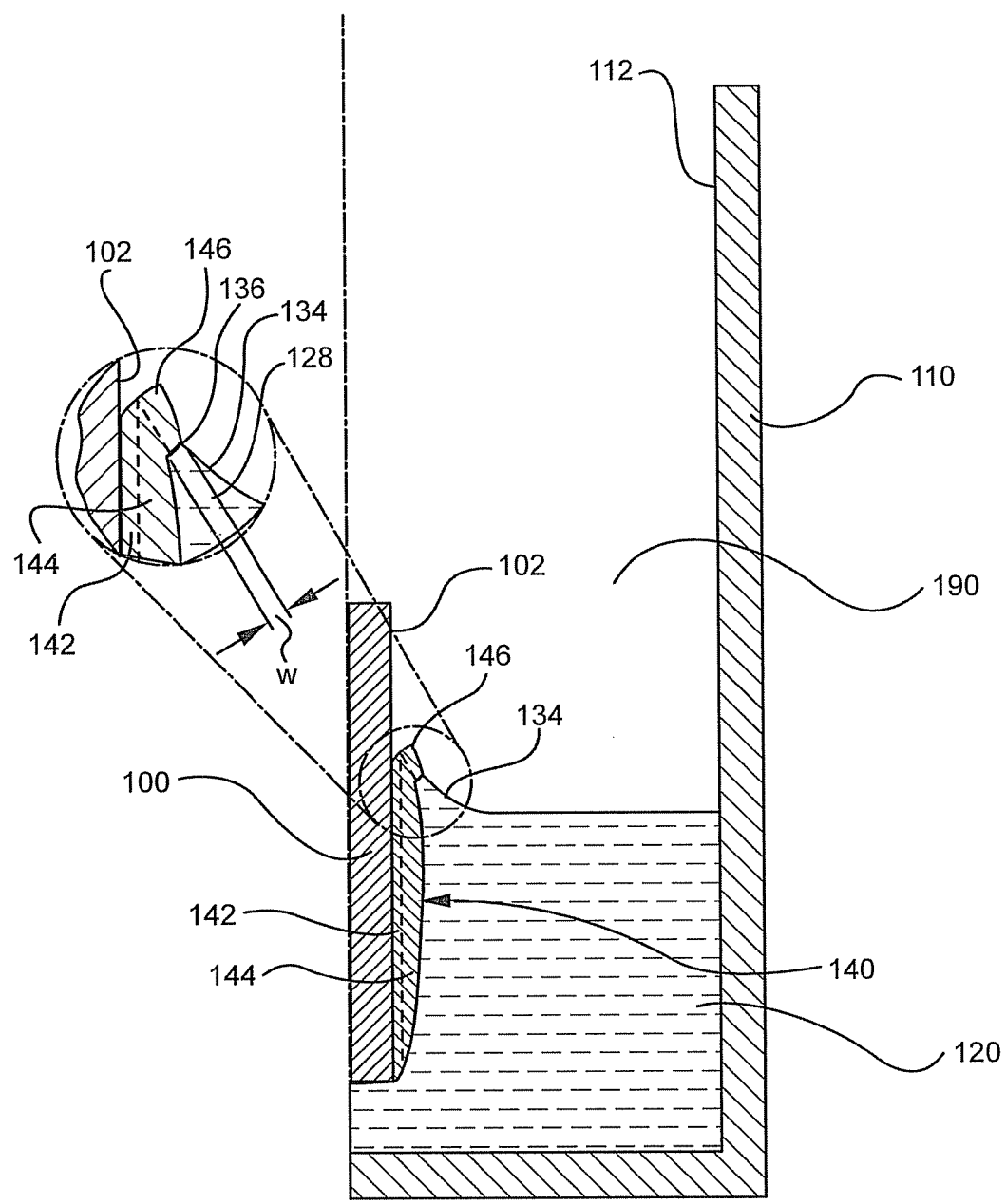
Figure 1H:
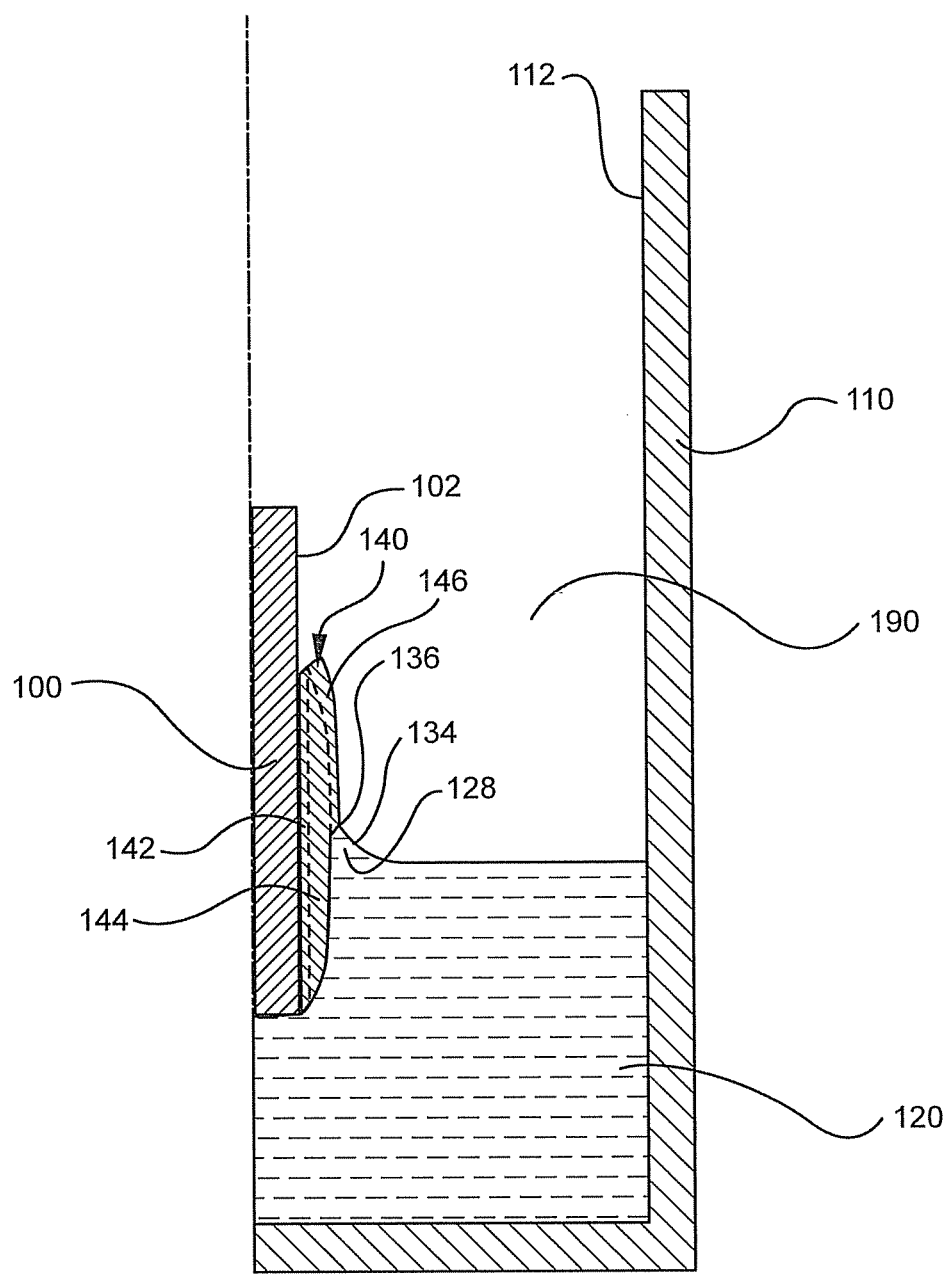
Figure 1I:
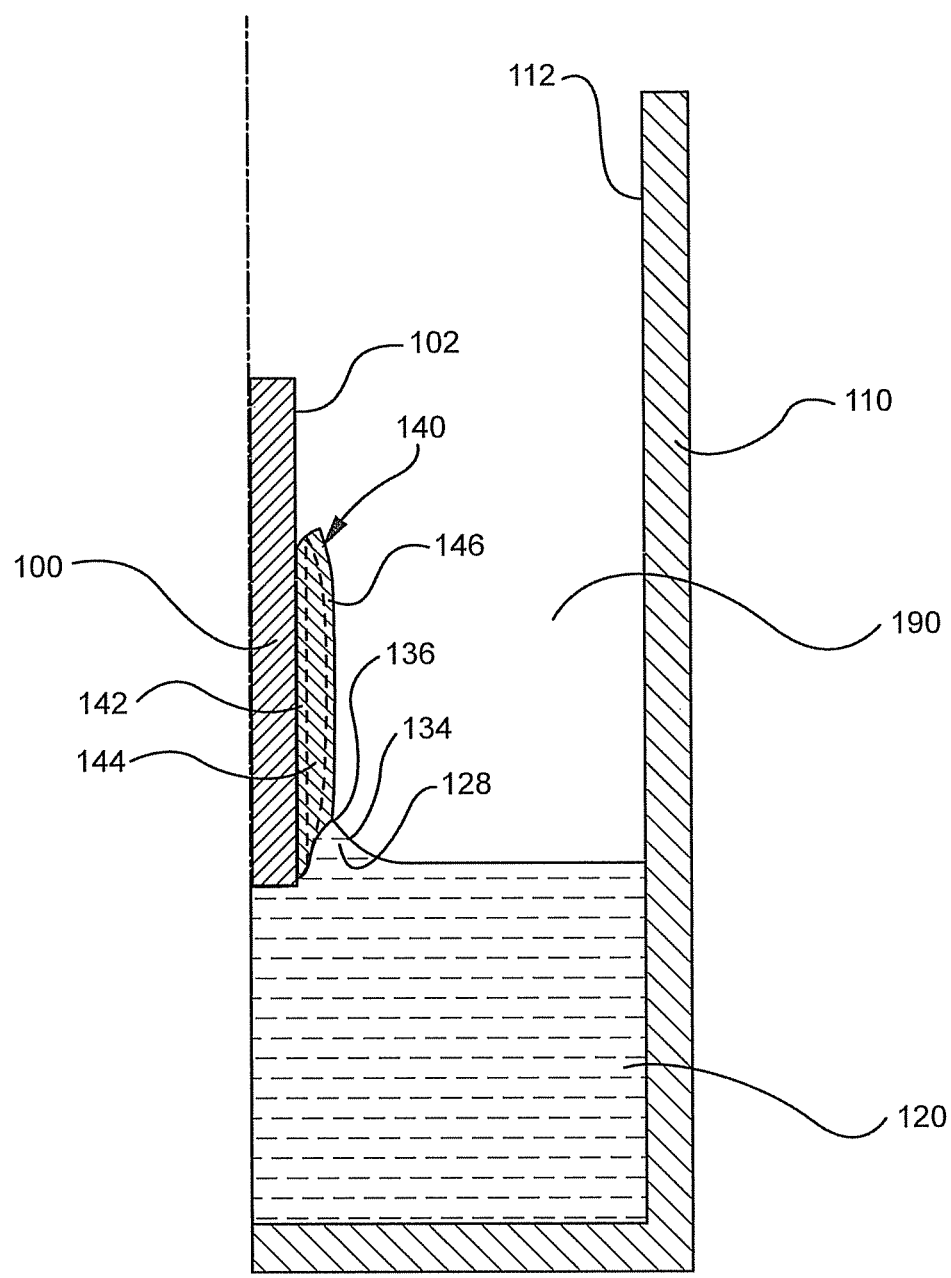
Figure 1J:
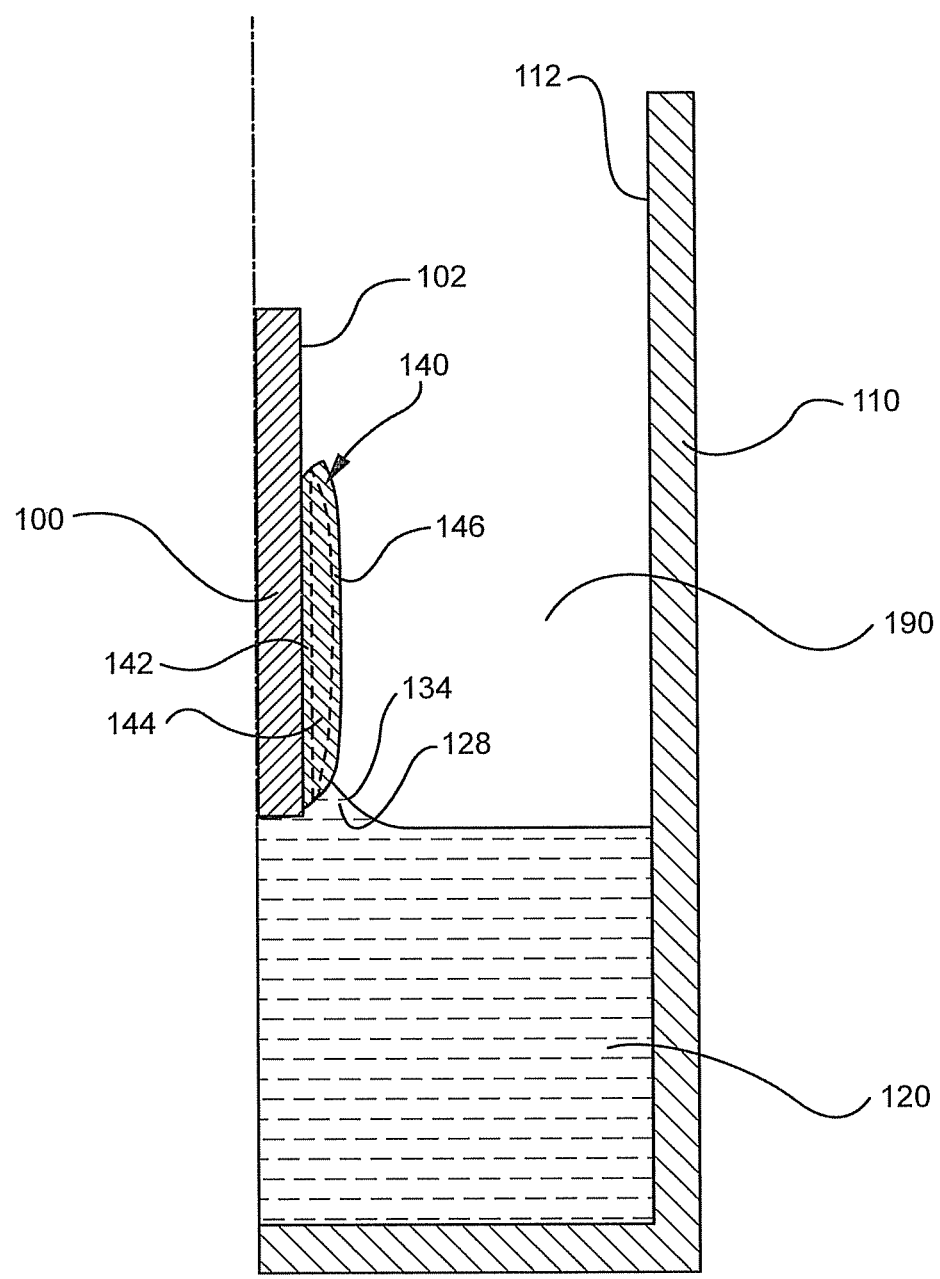
Figure 1K:
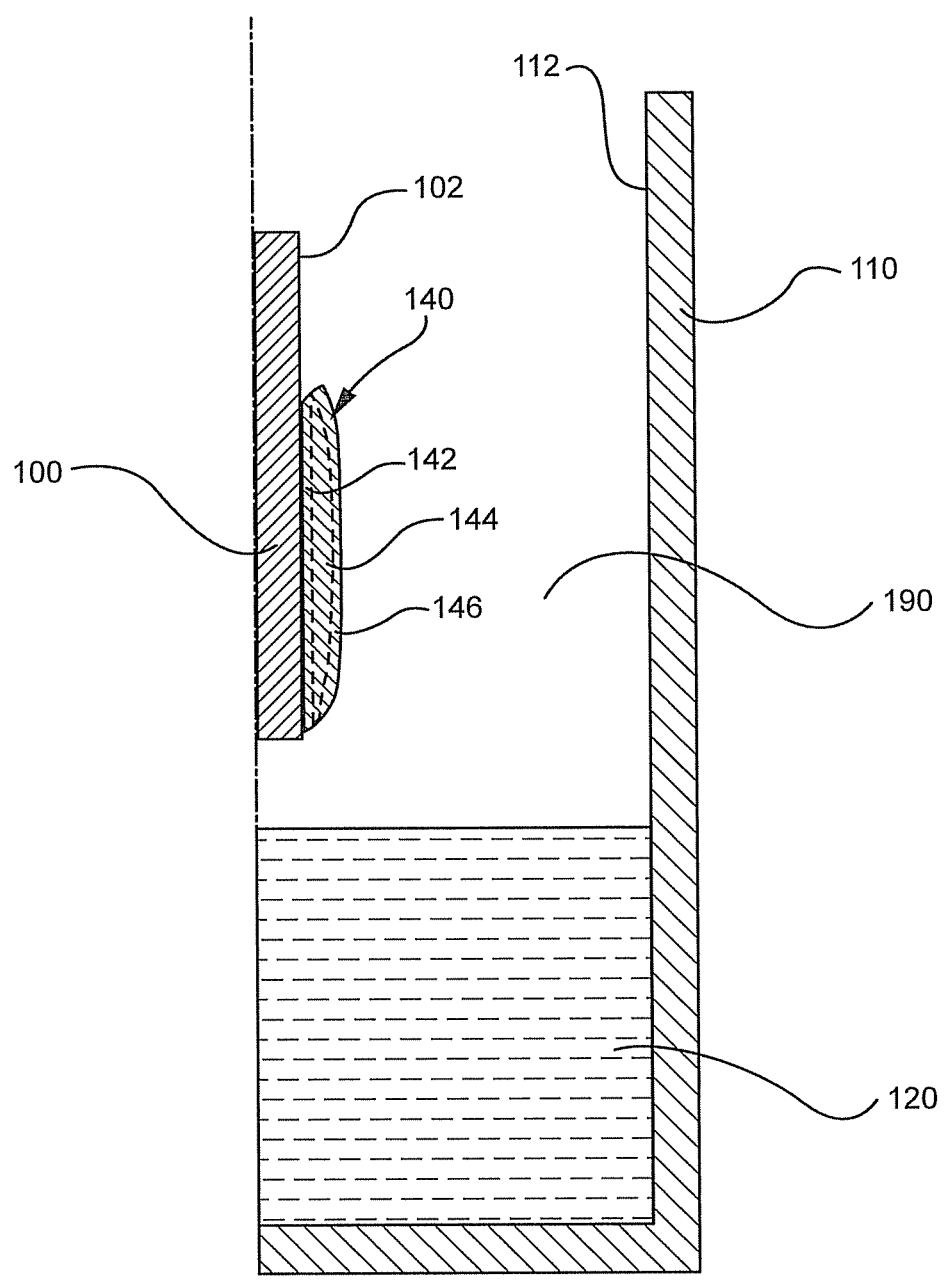
Figure 1L:
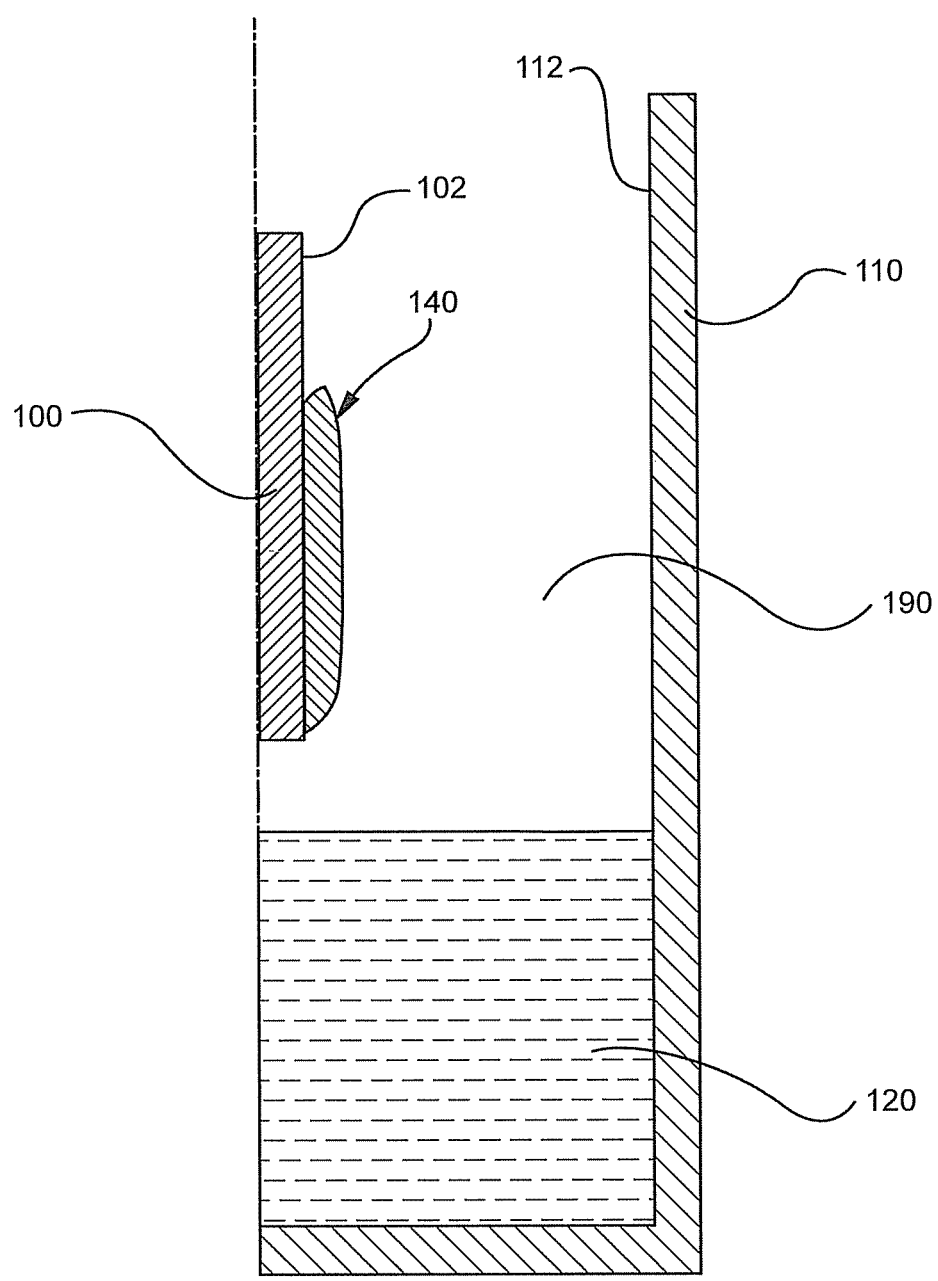

During withdrawal of the mold, because the exposed solid surface is solidified semiconducting material rather than the original mold material, the wetting dynamics between the solid surface and the melt are likely different from those encountered during submersion. Referring to FIG. 1G, in the example of molten silicon solidifying over a silicon solid layer 140, a dynamic, convex meniscus 134 forms at the solid-liquid-gas triple point. As a result of this dynamic meniscus 134, during withdrawal of the mold from the molten semiconducting material 120, an additional solid layer 146 (Stage III solid layer) forms over the previously-formed solid layers (Stage I and Stage II solid layers). The Stage III solid layer 146 is also referred to herein as the overlayer, and determines the minimum thickness of a solid layer obtained through exocasting.

Although the Stage II solid layer 144 that has formed over the Stage I solid layer 142 will continue to grow or remelt according to the local heat flux dynamics beneath the surface 122 of the molten semiconducting material 120, the Stage III solid layer 146 forms above the equilibrium surface 122 of the molten semiconducting material 120 due to the wetting of the solid silicon layer (e.g., exposed surface of the Stage II solid layer 144) by the molten semiconducting material 120. During withdrawal, a Stage III solid layer growth front 136 is continuously fed by molten material from beneath the dynamic meniscus 134.

In embodiments, it is desirable to minimize both the thickness and the surface roughness of the Stage III solid layer 146. By minimizing the thickness of the Stage III overlayer, a majority of the thickness of the solid layer 140 will be formed during Stage II (i.e., growth that is substantially perpendicular to the mold's external surface). Applicants have discovered that desired attributes of the Stage III solid layer 146, and hence solid layer 140, can be obtained by controlling one or more of a temperature, a force and a relative rate of withdrawal of the mold 102 from the molten semiconducting material 120 during the exocasting process.

As described further herein, the shape of the dynamic meniscus 134, and hence the shape of the Stage III growth front 136, can be affected by changing a process temperature, a force imposed upon the dynamic meniscus 134 and/or the withdrawal rate of the mold. These process variables can be used to increase or decrease a length of the Stage III growth front 136 and hence impact, for example, the thickness or roughness of the Stage III overlayer.

It will be understood that the process variables of temperature, force and velocity may or may not be independent from each other. By way of example, controlling the withdrawal rate of the mold 100 as it is removed from the molten semiconducting material 120 may affect heat transfer between two or more of the mold 100, the solid layer 140 formed over the mold, and the molten semiconducting material 120. Controlling the withdrawal rate of the mold may also affect the viscous and capillary forces acting on the dynamic meniscus 134. Thus, direct control of the withdrawal rate may indirectly impact one or more temperatures during the process.

Referring to FIGS. 1G-1J, the dynamic meniscus 134, the Stage II solid layer 144 and the Stage III layer 146 formed during withdrawal define a dynamic volume 128 or "dragged volume" of the melt that is located above the equilibrium surface 122 of the molten semiconducting material 120. The dynamic volume 128, which is approaching solidification as a result of the various heat transfer mechanisms, continuously feeds the Stage III solidification front 136 during withdrawal.

The thickness of the Stage III solid layer 146 can be decreased by decreasing a width W of the Stage III solidification front 136. In turn, the width W of the Stage III solidification front 136 can be decreased by changing the dynamic volume 128, which can be accomplished by decreasing the radius of curvature of the dynamic meniscus. Changes in temperature, force applied to the dynamic meniscus and/or the withdrawal rate of the solid mold that effectively "push" on the dynamic meniscus 134 and decrease the dynamic volume 128 will shorten the Stage III solidification front 136 and decrease the thickness of the Stage III overlayer 146.

Notwithstanding the effect that the withdrawal rate has on the total residence time (and growth versus remelting of the Stage II solid layer 144), changes in the rate of withdrawal may increase or decrease the thickness of the Stage III solid layer 146. Generally, faster withdrawal rates tend to entrain larger volumes of molten semiconducting material 120, which increases the amount of molten material within the dynamic volume 128. Whether the faster withdrawal rate causes an increase or a decrease in the Stage III solid layer thickness, however, may also depend on the solidification rate at the Stage III solidification front 136.

Figure 3:
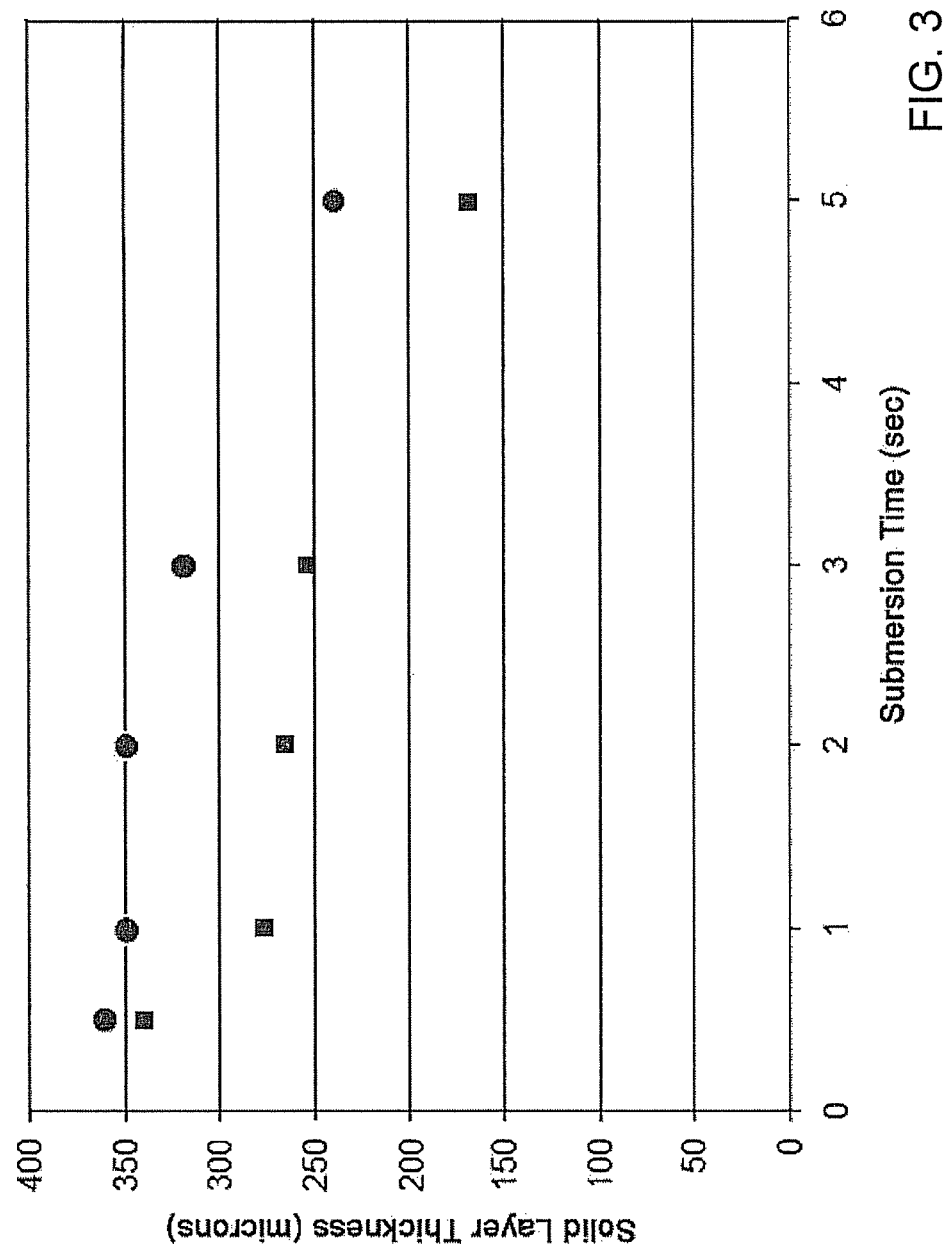
FIG. 3 is an experimental graph of a solid layer thickness versus submersion time for 1.2 mm thick molds at different withdrawal rates.
Figure 4:
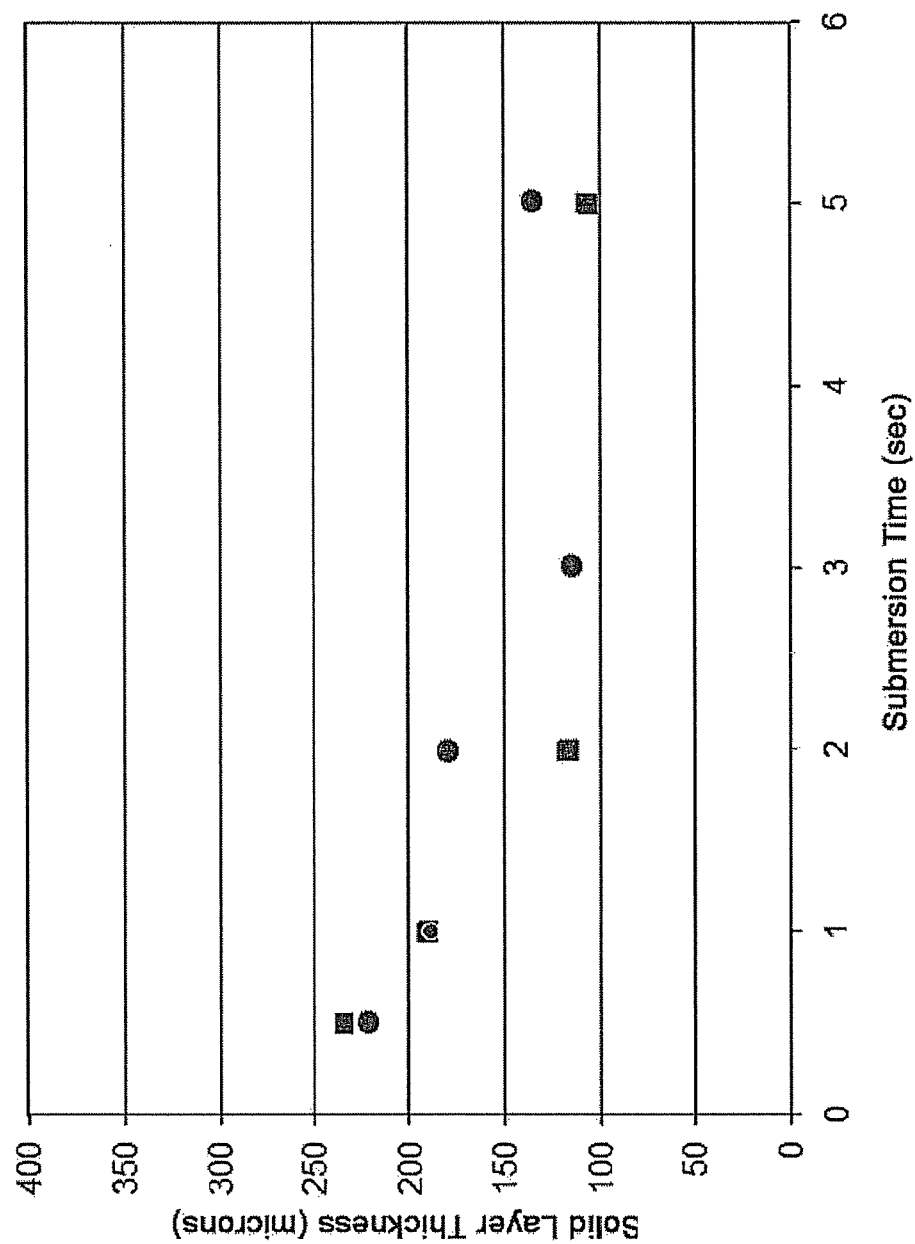
FIG. 4 is an experimental graph of a solid layer thickness versus submersion time for 0.8 mm thick molds at different withdrawal rates.

Experimental data showing the effect of the withdrawal rate and the submersion time on the thickness of the Stage III solid layer 146 are shown in FIGS. 3 and 4. In the data of FIGS. 3 and 4, a withdrawal rate of 10 mm/sec is indicated by squares, while a withdrawal rate of 5 mm/sec is indicated by circles. As seen in both FIGS., a thickness of the Stage III solid layer 146 decreases with increased submersion time due, at least in part, to greater heating of the mold at the longer submersion times and a concomitant decrease in the mold's thermal capacity.

For the 1.2 mm thick mold (FIG. 3), a 10 mm/sec withdrawal rate results in a thicker Stage III solid layer 146 than a 5 mm/sec withdrawal rate. As discussed above, the faster withdrawal rate results in the uptake of a greater volume of liquid from the dynamic volume. Due to the relatively high thermal capacity of the thicker mold, a majority of the liquid that is "dragged" over the mold solidifies into the Stage III overlayer.

For the 0.8 mm thick mold (FIG. 4), the thickness of the Stage III solid layer 146 also decreases with submersion time, but is relatively insensitive to the thickness of the mold. It is believed that the lower overall Stage III solid layer thicknesses compared with the thicker 1.2 mm mold is due to the lower thermal capacity of the thinner 0.8 mm mold. Specifically, while greater withdrawal rates entrain a greater amount of liquid from the dynamic volume, a lesser volume of the entrained liquid solidifies due to the higher mold temperature (and resulting lower thermal capacity). As seen in FIG. 4, at longer submersion times, the thickness of the Stage III solid layer approaches an experimentally-determined minimum of about 100 microns for the silica mold-molten silicon system.

Figure 5:
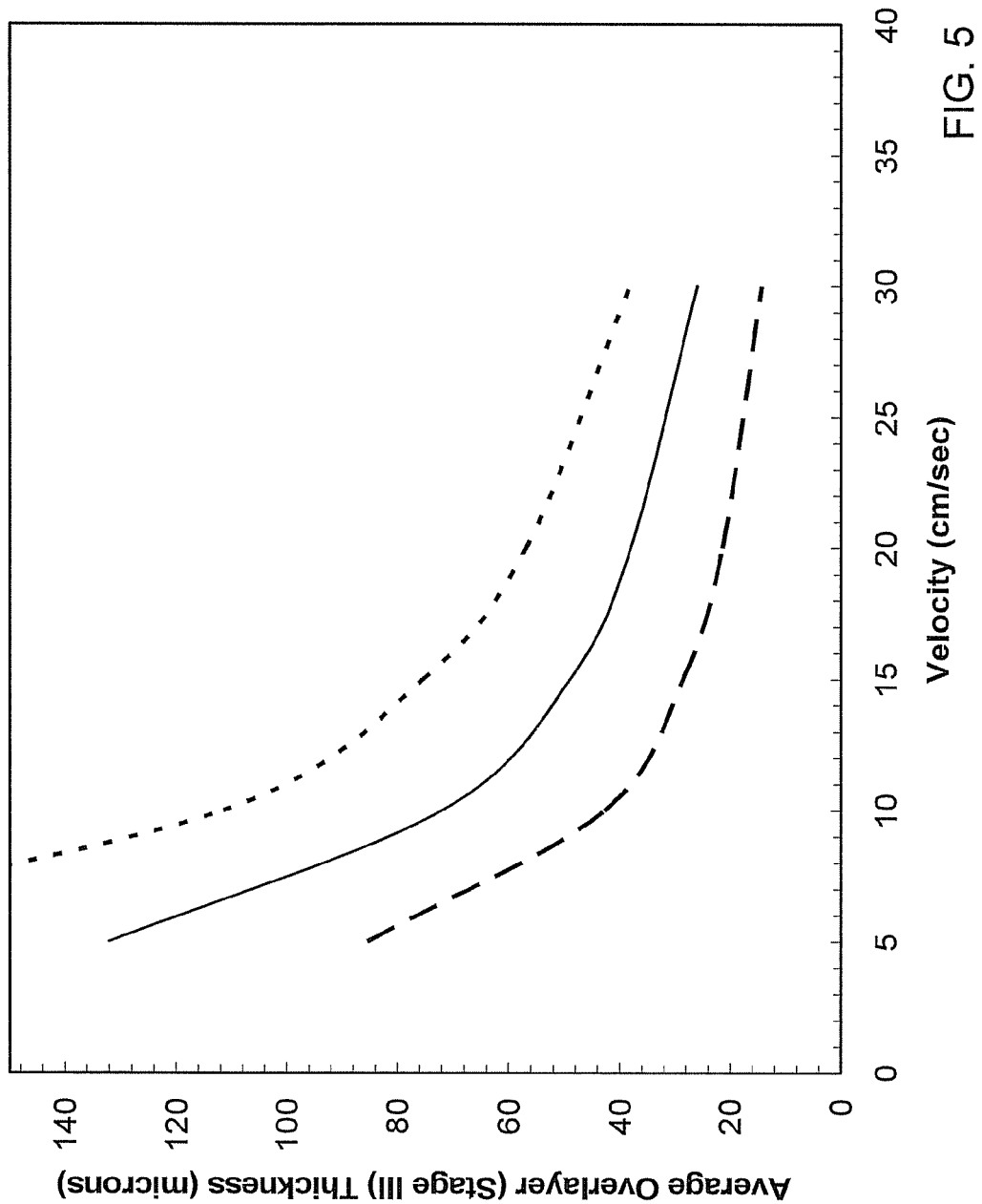
FIG. 5 is a theoretical graph of a solid layer thickness versus withdrawal rate for different mold thicknesses.

The results of theoretical calculations for the thickness of the Stage III overlayer versus withdrawal rate are shown in FIGS. 5 and 6. In FIG. 5, the dotted line represents a mold having a thickness of 4 mm, the solid line represents a mold thickness of 2 mm, and the dashed line represents a mold that is 1 mm thick. For a given withdrawal rate, thicker Stage III solid layers are formed over thicker molds, which have a higher thermal capacity.

FIG. 6 is a graph of thickness of the Stage III overlayer versus withdrawal rate for different initial mold temperatures. In FIG. 6, the solid line represents a mold having an initial temperature of 100° C., the dashed line represents a mold having an initial temperature of 500° C., and the dotted line represents a mold having an initial temperature of 1000° C. For a given withdrawal rate, thicker Stage III solid layers are formed over molds that have a lower initial (pre-submerse) temperature.

In embodiments, the withdrawal rate can be from about 1 to 50 cm/sec, e.g., 2, 5, 10 or 20 cm/sec. Higher withdrawal rates may cause fluid drag that can induce perturbations into the dynamic meniscus, which can be transferred to the Stage III overlayer. One of ordinary skill in the art would therefore recognize that the withdrawal rate may be selected based on the desired cross-section, including thickness, thickness uniformity and roughness of the exocast article, as well as other factors that influence the solid layer such as the thermal capacity of the mold, the temperature of the atmosphere above the molten semiconducting material, and any other process steps that are used to produce the exocast article.

In addition to controlling the rate of withdrawal of the mold, in various embodiments, the thickness and other attributes of the Stage III overlayer may be affected by controlling a temperature of, for example, one or more of the mold 100, the dynamic volume 128, the Stage III growth front 136, or solid overlayer 140. The initial temperature of the mold 100 may be increased, for example, by pre-heating the mold or by holding the mold above the molten semiconducting material 120 before it is submersed. It is also possible to control temperature during and after withdrawal of the mold.

Various heat sources or heat insulators may be used to control heat flow and hence temperature. Examples of suitable heat sources include, but are not limited to, resistive windings, lasers, burners, and plasma jets that can direct heat to a particular location. Passive heating sources such as mirrors that redirect infrared radiation from the molten semiconducting material 120 to the overlayer 146 may also be used. Such heat sources may be positioned proximate to the mold 100, the molten semiconducting material 120, and/or the solid layer 140. For example, a heat source can be mounted on vessel wall 112 and provide a heat output that is directed at one or more of the mold 100, the dynamic volume 128, the Stage III growth front 136, or the solid overlayer 140 as the mold is withdrawn from the molten semiconducting material.

The various heat source(s), in addition to or in lieu of directly heating one or more of the mold 100, the dynamic volume 128, the Stage III growth front 136 or solid overlayer 140, can also be used to supply indirect heat such as, for example, by controlling a temperature of the atmosphere surrounding the mold as it is removed from the molten semiconducting material.

According to various additional embodiments, the thickness, roughness and/or other attributes of the Stage III overlayer 146 may be affected via direct application of a force or other physical constraint. Such a force may comprise a heated, unheated, reactive or non-reactive flow of gas (e.g., gas jet) that is directed at, for example, the dynamic meniscus. A single gas jet or multiple gas jets directed at different positions may be used. A heated gas jet may comprise a flame (e.g., hydrogen flame) or a plasma jet. A gas jet may be chosen such that it contains an inert gas or, in alternate embodiments, a dopant or other material to be incorporated into or on a surface of the final exocast article. A gas jet may supply a force, such as in the form of a hydrostatic pressure, which can be used to modify the shape of the dynamic meniscus 134 and/or the volume of the dynamic volume 136.

According to various embodiments, a physical constraint may comprise a mechanical barrier that may be used to modify the volume of molten semiconducting material within the dynamic volume. For example, a mold having a solid layer formed over its external surface with a dynamic volume wetting the solid layer may be pulled through a slot that having an edge that is positioned to decrease the volume of molten semiconducting material within the dynamic volume. Such a slot may act as a wiper or squeegee. Variants of the slot include drawing the dynamic meniscus across a material such as fabric, a non-woven web, felt, or paper. In at least one further embodiment, the dynamic meniscus may be drawn across a blade or knife edge.

The disclosed methods can be used to produce articles of semiconducting material having one or more desired attributes related to, for example, total thickness, impurity content and/or surface roughness. Such articles, such as, for example, silicon sheets, may be used to for electronic devices such as photovoltaic devices. By way of example, an as-formed silicon sheet may have areal dimensions of about 156 mm×156 mm, a thickness in a range of 100 µm to 400 µm, and a substantial number of grains larger than 1 mm. In embodiments, a total thickness of the solid layer is 150, 200, 250, 300, 350 or 400 µm. In further embodiments, a total thickness of the solid layer is less than 400 µm (e.g., less than 350, 300, 250, 200 or 150 µm).

After mold 100 is removed from vessel 110 and sufficiently cooled, the solid layer 140 of semiconducting material may be removed or separated from the mold 100 using, for example, differential expansion and/or mechanical assistance. Alternatively, the solid layer 140 may remain on mold 100 as a supported article of semiconducting material.

Unless otherwise indicated, all numbers used in the specification and claims are to be understood as being modified in all instances by the term "about," whether or not so stated. It should also be understood that the precise numerical values used in the specification and claims form additional embodiments. Efforts have been made to ensure the accuracy of the numerical values disclosed herein. Any measured numerical value, however, can inherently contain certain errors resulting from the standard deviation found in its associated measuring technique.

It is noted that as used in this specification and the appended claims, the singular forms "a," "an," and "the," include plural referents unless expressly and unequivocally limited to one referent, and vice versa. Thus, by way of example only, reference to "a solid layer" can refer to one or more layers, and reference to "a semiconducting material" can refer to one or more semiconducting materials. As used herein, the term "include" and its grammatical variants are intended to be non-limiting, such that recitation of items in a list is not to the exclusion of other like items that can be substituted or added to the listed items.

It will be apparent to those skilled in the art that various modifications and variation can be made to the programs and methods of the present disclosure without departing from the scope its teachings. Other embodiments of the disclosure will be apparent to those skilled in the art from consideration of the specification and practice of the teachings disclosed herein. It is intended that the embodiments described in the specification be considered as exemplary only.

We claim:

1. A method of making an article of a semiconducting material, comprising:
providing a mold submersed in molten semiconducting material having a solid layer of the semiconducting material formed over an external surface of the mold;
changing a relative position of the mold with respect to the molten semiconducting material so as to withdraw the mold having the solid layer from the molten semiconducting material;
controlling one or more of a temperature, a force, and a relative rate of withdrawal during the act of withdrawal so as to achieve one or more desired attributes in a solid overlayer of semiconductor material that is formed over the solid layer during the act of withdrawal via solidification of a portion of a dynamic meniscus of the molten semiconducting material.

2. The method according to claim 1, wherein changing a relative position of the mold comprises one or more of a translation and a rotation of the mold, and/or one or more of a translation and a rotation of a vessel containing the molten semiconducting material.

3. The method according to claim 1, wherein controlling one or more of a temperature, a force, and a relative rate of withdrawal comprises controlling one or more temperatures, one or more forces and/or one or more relative rates.

4. The method according to claim 1, wherein the controlling comprises controlling each of a temperature, a force, and a relative rate of withdrawal.

5. The method according to claim 1, wherein the controlling comprises controlling a radius of curvature of the dynamic meniscus.

6. The method according to claim 1, wherein the controlling comprises controlling a volume of a dynamic volume.

7. The method according to claim 1, wherein the controlling comprises pre-heating the mold prior to providing the mold submersed in the molten semiconducting material.

8. The method according to claim 1, wherein the controlling comprises heating the dynamic meniscus using a heat source selected from the group consisting of a laser, a plasma jet, and a resistive heat source.

9. The method according to claim 1, wherein the controlling comprises controlling a temperature of a gas in thermal contact with the dynamic meniscus.

10. The method according to claim 1, wherein the controlling comprises controlling heat transfer between a gas in thermal contact with the dynamic meniscus and the dynamic meniscus and/or a gas in thermal contact with the dynamic meniscus and the overlayer.

11. The method according to claim 1, wherein the controlling comprises applying a physical constraint to the dynamic meniscus.

12. The method according to claim 9, wherein the physical constraint is selected from the group consisting of fabric, felt, paper and a non-woven web.

13. The method according to claim 1, wherein the one or more attributes of the solid layer are selected from the group consisting of thickness, composition, microstructure, and topography.

14. The method according to claim 1, wherein a total thickness of the article is less than 400 μm.

15. The method according to claim 1, wherein the attribute is selected from the group consisting of a thickness of the solid overlayer and a roughness of the solid overlayer.

* * * * *